United States Patent [19]

Patch et al.

[11] 4,388,703
[45] Jun. 14, 1983

[54] MEMORY DEVICE

[75] Inventors: Richard J. Patch; George D. Rose, Jr., both of Lynchburg, Va.

[73] Assignee: General Electric Company, Lynchburg, Va.

[21] Appl. No.: 181,423

[22] Filed: Aug. 26, 1980

Related U.S. Application Data

[63] Continuation-in-part of Ser. No. 37770, May 10, 1979, abandoned.

[51] Int. Cl.³ .................. G11C 11/40; G11C 17/06
[52] U.S. Cl. .................................... 365/105; 365/100
[58] Field of Search .............. 365/96, 100, 104, 105

[56] References Cited

U.S. PATENT DOCUMENTS

| | | | |
|---|---|---|---|
| 3,245,051 | 4/1966 | Robb | 365/96 |
| 3,641,516 | 2/1972 | Castrucci et al. | 365/96 |
| 3,810,127 | 5/1974 | Hoff, Jr. | 365/105 |
| 3,848,238 | 11/1974 | Rizzi et al. | 365/105 |
| 4,152,627 | 5/1979 | Priel et al. | 365/96 |

*Primary Examiner*—Terrell W. Fears
*Attorney, Agent, or Firm*—Michael Masnik

[57] ABSTRACT

A memory device is provided for an integrated injection logic (I²L) device in solid state form by a resistor connected at one end to the logic device, and a diode having its cathode connected to the other end of the resistor at a programming junction, and its anode connected to a common point. If the diode conductors are melted or deformed by reverse diode current from the programming junction to the common point, a low impedance path is formed, and the logic portion is provided with a first logic input. If the diode conductors are left unmelted or intact, the logic portion is provided with a second logic input.

12 Claims, 4 Drawing Figures

MEMORY DEVICE

BACKGROUND OF THE INVENTION

This is a continuation-in-part of application Ser. No. 037,770, filed May 10, 1979, now abandoned.

Our invention relates to a cascaded memory device, and particularly to a method and means for programming said device to provide desired serial logic outputs.

Memory devices of the permanent type which can be programmed in the field (as contrasted with a manufacturing plant) are sometimes referred to as programmable read only memories (PROM). One such PROM device uses a resistance lead or element which is opened by an electric current to provide the desired programming input condition. However, such an opening leaves debris or random paths which introduce leakage that may be undesirable or unacceptable. Another such PROM device uses electrically programmable MOS devices. However those devices require or operate with a relatively large voltage, for example 5 volts. In many applications, a single cell battery with a nominal voltage of about 1.5 volts must be used, so that those electrically programmable PROM devices cannot be used. In such low voltage applications, I²L devices can be employed. Thus, there is a need for I²L programmable memory devices. If those devices must be programmed at a manufacturing plant where manufacturing techniques are available, an inventory of all possible programmed memories must be kept on hand (a relatively wasteful condition). Or, each memory must be programmed in response to a specific request (a condition that may be slow if there is a backlog of requests).

Accordingly, a primary object of our invention is to provide a new and improved I²L memory device which can be easily programmed.

Another object of our invention is to provide a new and improved memory device which can be easily programmed by a relatively unskilled person, or which can be programmed by almost anyone with relatively simple apparatus.

Another object of our invention is to provide a new and improved integrated injection logic memory device that has a standard form or arrangement, and that can be easily programmed in accordance with any desired need.

Another object of our invention is to provide a novel integrated injection logic memory device that has a single arrangement for mass production, and that can be easily programmed with relatively simple equipment at the location where the desired memory information becomes known or determined.

Another object of our invention is to provide a new and improved integrated injection logic memory device that can be easily programmed in the field by the user.

Another object of our invention is to provide a new and improved integrated injection logic memory device having means which can be easily and permanently programmed and which, if not permanently programmed, can be electrically programmed by static and dynamic circuit conditions.

SUMMARY OF THE INVENTION

Briefly, these and other objects are achieved in accordance with one embodiment of our invention by one or more monolithic integrated logic memory devices each having a resistor and programmable diode or unidirectional conducting device connected to the respective integrated logic device input. The diode has one terminal connected to the resistor at a programming junction, and its other terminal connected to a point of reference potential or ground. If a diode is left intact or unmodified, one logic condition is presented to its respective integrated injection logic device input. However, if the diode junction and leads are modified or melted by applying a suitable voltage and current to the programming junction of the diode and the resistor, current flows in the reverse direction through the diode to melt the diode junction and leads and effectively ground the programming junction. This provides a second logic condition to its respective integrated injection logic device input. The resistor is provided to prevent excessive current from flowing into the logic device input during programming. An an alternative, dynamic logic signals may be applied to the unprogrammed junction to dynamically establish logic states at the junctions. The logic memory devices provide a serial output in accordance with the established logic states at said junctions. Thus, it is relatively simple to program each memory device in accordance with any desired condition or arrangement. Such programming can be done by relatively unskilled people with relatively simple equipment, so that our improved memory device provides a single versatile structure that can be programmed to suit any need.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

DESCRIPTION OF THE PREFERRED EMBODIMENT

Figure 4:
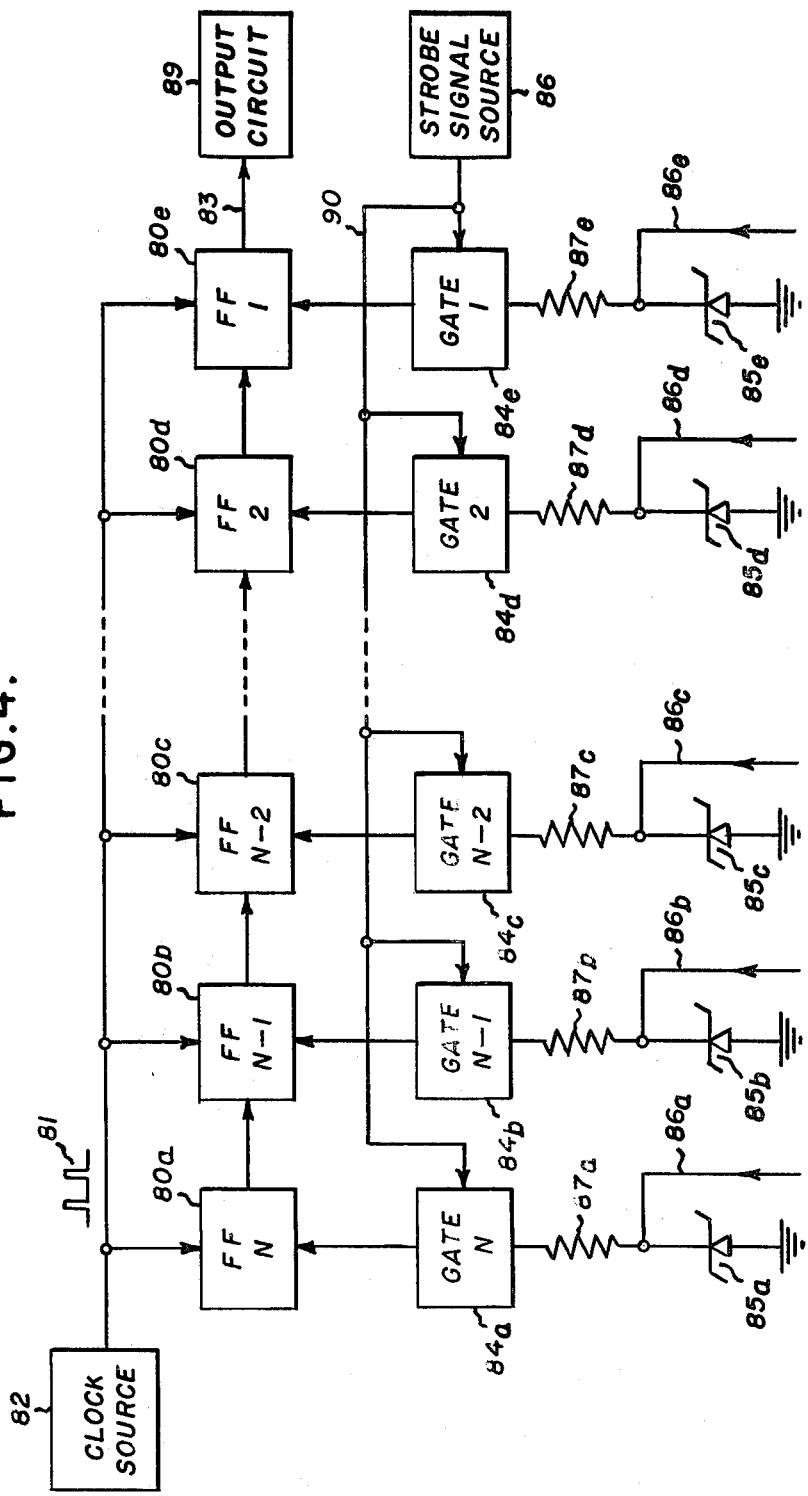
FIG. 4 shows an array of cascaded logic elements programmed to provide a desired serial logic output in accordance with the present invention.

Referring to FIG. 4 there is shown an array of cascaded logic elements, such as flip-flops, 80a through 80e in the form of a shift register which respond to clock pulses 81 available from source 82 to successively shift the logic states stored in each of the registers towards the output lead 83 for each application of a clock pulse. The result is a serial logic output on 83 corresponding to the states previously stored in the logic elements. Logic states of each of the logic elements 80a through 80e are programmed by the use of gates 84a through 84e. The act of supplying a strobe signal on lead 90 from source 86 to each of the gates 84 results in loading the logic state of each of the gates 84 into its associated flip-flop 80. The logic state of each of the gates 84 can be established either by programing associated diodes 85a through 85e, as will be described shortly, or by applying programming signals over leads 86a through 86e. Initially, the diodes 85a through 85e are provided in, for example, the logic one state, which may be established at time of manufacture. In this state, they are open circuited, thereby decoupling the associated gate 84 from ground. Also, it is assumed that initially there are no signals on the input leads 86a through 86e. Under these circumstances, each of the gates is programmed to be at a logic 1 state. Where it is desired that the logic state of the gates be changed to logic 0, then the respectively associated diodes 85a through 85e are caused to break down in the following manner. A sufficiently large voltage is applied between the desired leads 86a through 86e and ground which causes current to flow through the associated diodes 85a through 85e resulting in the diode short circuiting and coupling the associated logic gates 84a through 84e to ground through resistors 87a through 87e. The resistors 87a through 87e are dimensioned to limit the current flow into the gates 84a through 84e during the programming of the diode. If this were not done, then irreversible damage could occur in the logic gates 84a through 84e. For purposes of discussion let us assume that only diodes 85a, 85c and 85e were programmed to break down such that the associated gates were at logic states 0. The remaining gates would be at a logic state 1. However, it is possible by applying a lower level voltage over leads 86b and 86d to cause their associated logic gates 84 to assume the logic state of the signal applied to leads 86b and 86d. Furthermore, this logic state may be changed from time to time as desired. In essence, therefore, we have provided a shift register which can be programmed permanently or dynamically or a combination of both. A shift register with these versatile features is useful in a number of applications, as for example, in the low density coding device for pagers and personal radios. In such an application it is desirable to store a paging address or identification code in the shift register and to be able to clock the stored information to an output circuit 89 on command.

Figure 1:
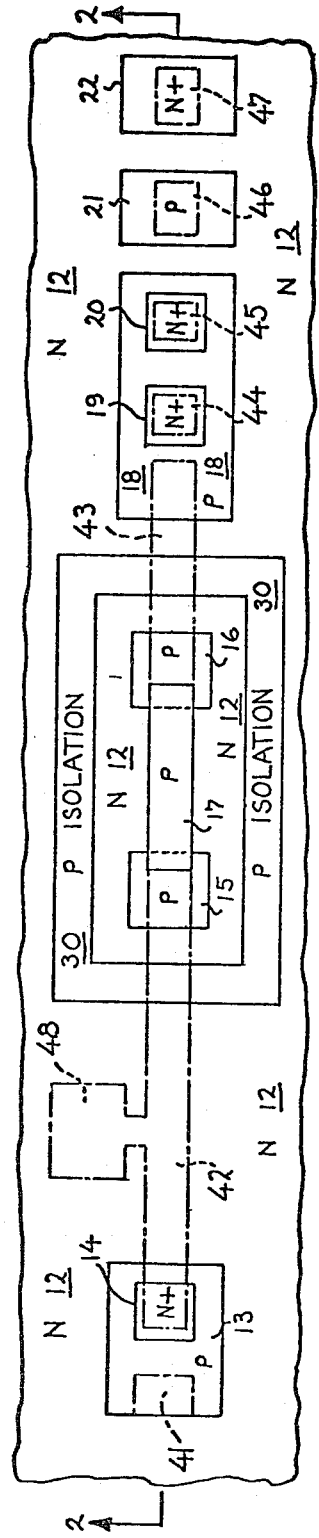
FIG. 1 shows a top plan view of one memory device employed in the arrangement of FIG. 4 in accordance with our invention and its associated logic circuit, FIG. 1 being taken along the line 1—1 in FIG. 2.
Figure 2:
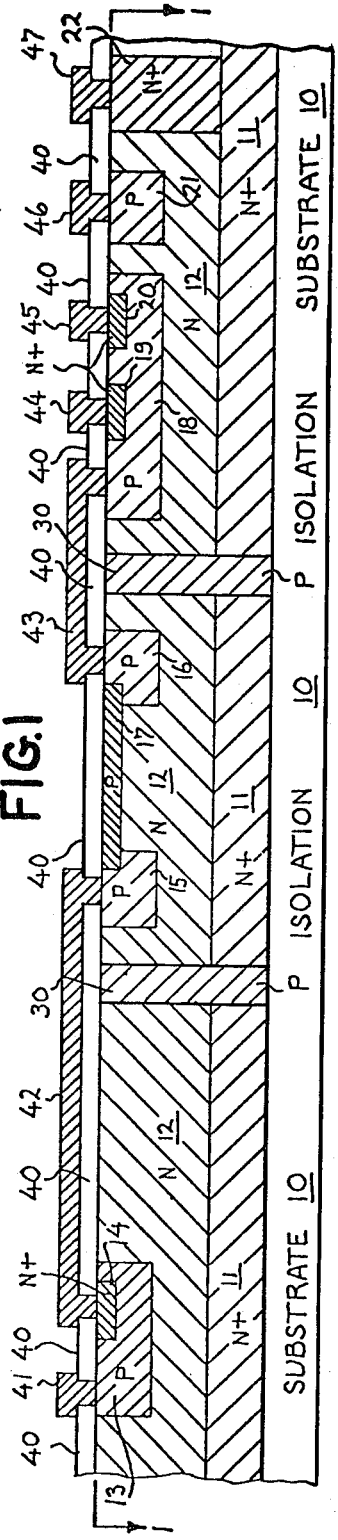
FIG. 2 shows a cross-sectional view of our memory device and logic circuit taken along the line 2—2 in FIG. 1.

In FIGS. 1 and 2, we show a top plan view and a cross-sectional view respectively of our memory device and the logic circuit associated with it. While these figures are not shown to any relative scale as far as an actual device is concerned, the figures are correspondingly positioned. In these figures, we show only one logic circuit, and only one programmable memory device in accordance with our invention. However, it is to be understood that a plurality of such logic circuits and of such programmable memory devices would normally be provided.

Our memory invention and the logic circuit are provided in integrated injection logic (I²L) form. Such a form normally includes a substrate 10 which provides support and insulation, and which may be made of any suitable material such as silicon. A buried layer 11 of N+ type material such as arsenic doped silicon is formed on the substrate 10, and an epitaxial or epi-layer 12 of N type material is grown on the substrate 10 and the buried layer 11.

The integrated injection logic device includes a region 21 of P type material such as boron doped silicon. This material is diffused or implanted into the epi-layer 12. Another region 18 of P type material is provided in the epi-layer 12, and one or more regions 19, 20 of N+ type material are provided in the region 18, all as shown in the right hand portions of FIGS. 1 and 2. In addition, a region 22 of N+ type material is provided from the upper surface to the buried layer 11 to provide a ground for the logic device. The various regions at the upper surface are provided with a suitable layer 40 of insulating material such as silicon dioxide, and the particular regions 22, 21, 20, 19, 18 are respectively provided with external metallic leads or terminals 47, 46, 45, 44, 43. These terminals may be aluminum. They are shown in phantom in FIG. 1 in the interest of clarity.

Figure 3:
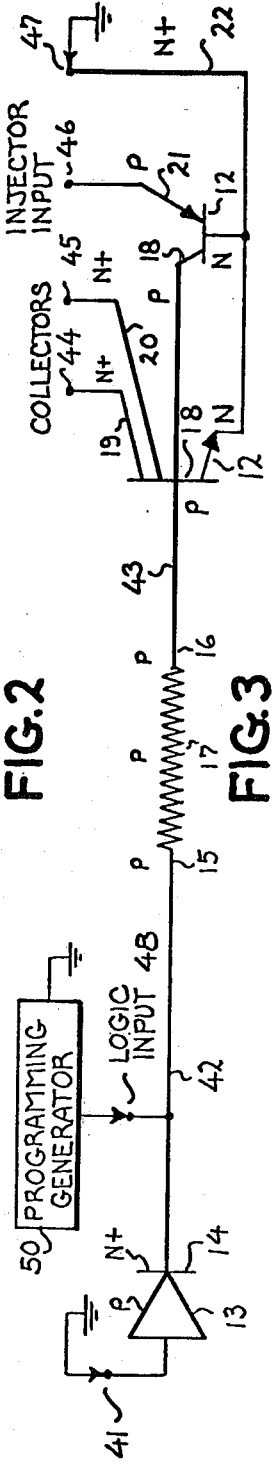
FIG. 3 shows an equivalent circuit diagram of our memory device and logic circuit of FIGS. 1 and 2.

As shown by the equivalent circuit in FIG. 3, the P region 21, the N epi-layer 12, and the P region 18 form the emitter, base, and collector respectively of a horizontal PNP type injection transistor. The N+ regions 19, 20, the P region 18, and the N epi-layer 12 form the collectors, base, and emitter respectively of a vertical logic transistor. The P region 18 is thus common to both transistors. The terminal 46 would be connected to a suitable current source, and the collectors 44, 45 would be connected to suitable output circuits, which may be included in the same structure shown, or in an external structure. The structure described thus far forms a known integrated injection logic device whose input would be connected to the base terminal 43 of the vertical transistor, and whose output would be provided at the collector terminals 44, 45 of the vertical transistor.

In order to provide a programmable memory for the logic device described, we provide a resistor and diode connected to the logic transistor as shown schematically in FIG. 3. As shown in FIGS. 1 and 2, the resistor is provided in a wall of P type isolation material 30 extending from the upper surface to the substrate 10, and enclosing the N epi-layer 12 and the N+ buried layer 11. The resistor itself is formed by two P regions 15, 16 and a connecting P region 17. These P regions may be diffused or implanted. The terminal 43 connects the P region 16 to the P region 18. The anode of the diode is provided by a P region 13 in the N epi-layer 12, and the cathode is provided by an N+ region 14 in the P region 13. A metallic lead 42 connects the N+ region 14 (or diode cathode) to the P region 15 of the resistor. A programming or logic input terminal 48 is connected to the lead 42. A lead or terminal 41 is connected to the P region 13 forming the diode anode. These leads may also be aluminum. The terminal 41 would be connected to ground or a point of reference potential. Thus as shown in FIG. 3, a resistor has one end connected to the base 18 of the logic transistor. The other end of the resistor is connected by a lead or conductor 42 to the diode cathode formed by the N+ region 14. The diode anode formed by the P region 13 is connected to ground or a point of reference potential. Thus the forward direction of conduction in the diode is from ground to the terminal 42.

If the formed diode is left intact, and if no signal is applied to the programming or logic input terminal 48, the base 18 of the logic transistor is floating. When supplied with an injector input current, the injector transistor causes the logic transistor to conduct from its collectors to its emitter. This provides one logic condition. However, if the diode is modified so as to ground the programming or logic input terminal 48, the base 18 of the logic transistor is grounded so that it does not conduct. Hence, another logic condition is provided at the collectors of the logic transistor.

The diode can be programmed by a programming generator 50 that provides a suitable programming input of predetermined voltage and current in the reverse direction through the diode for a predetermined time. This programming input is supplied to the terminal 48 as a positive voltage with respect to ground. When this input is applied, the formed resistor (which may be in the order of 1,000 to 10,000 ohms) does not permit much current to flow toward the logic transistor. Consequently, the programming current flows primarily in the reverse direction through the formed diode. This current causes the diode to heat and melt the conductors 41, 42 connected to N+ region 14 and the P region 13. The electric field that is present causes the melted conductors 41, 42 to flow through the softened regions 13, 14 and form a metallic path across or through those regions 13, 14. When the melted conductors 41, 42 cool and solidify, they form essentially a short circuit or very low impedance path (less than 1 ohm) between the terminals 41, 42. If the terminal 41 is grounded, this ground appears at the base of the logic transistor to supply the desired logic condition that is opposite to the floating condition if no ground is provided.

It will thus be seen that we have provided a new and improved device or method for easily programming one or more integration injection logic devices. The programming is provided or obtained with relatively simple equipment, namely a programming generator that supplies the desired current for the desired length of time. For one diode having a reverse breakdown voltage of 5 volts, this programming was provided with a constant current of 300 milliamperes for 3 milliseconds. The programming generator can be connected to each terminal 48 which is to provide the desired memory condition for its respective logic transistor. Other terminals can be selectively left unprogrammed. These unprogrammed terminals may be electrically programmed by logic signals if desired under various operating conditions. Thus, one standard arrangement of any number of integrated injection logic devices, each with our programming device, can be programmed as desired in accordance with our invention. Our programming device and method are relatively simple, and permit almost anyone to do this programming in the field (i.e. away from the manufacturing plant), thus increasing the uses and versatility of integrated injection logic devices.

While we have shown only one embodiment of our invention, persons skilled in the art will appreciate the many modifications that may be made. For example, the integrated injection logic devices may take a variety of different forms, depending upon the exact manufacturing conditions and preferences. And, any number of these devices may be programmed in accordance with our invention, by almost any type of programming generator that supplies the proper voltage and current for the desired duration. The programmable diodes may be connected with their anodes connected to the resistors and their cathodes connected to ground if the forward voltage drop of the diodes is sufficiently high so as not to ground the base of the logic transistor. If that forward voltage drop is insufficient, two or more diodes can be connected in series. Such diodes would also be programmed with current in the reverse direction. However, we prefer that the diodes be connected as shown in the drawing, since that arrangement is more reliable. Therefore, while our invention has been described with reference to a particular embodiment, it is to be understood that modifications may be made without departing from the spirit of the invention or from the scope of the claims.

What we claim as new and desire to secure by Letters Patent of the United States is:

1. A monolithic integrated circuit comprising a plurality of logic devices each comprising an input, a plurality of programmable circuits each comprising a resistor and a diode device and adapted to be programmed in response to application of programming signals, said logic devices normally being adversely affected by the application of programming signals, each of said resistors coupling a selected one of said logic device inputs through a respective, associated diode device to a common reference point, each of said diode devices initially exhibiting a high impedance, means for modifying said logic devices comprising means for applying programming signals to the junctions between selected ones of said resistors and their associated diode devices to cause said last named diode devices to irreversibly exhibit a bidirectional low impedance which establishes the associated reference states at said last names junctions, said resistors being dimensioned to block such adverse programming signal effects on said logic elements by said first means.

2. The improved memory device of claim 1 wherein each diode device presenting a low impedance from said resistor to said common reference point comprises a path formed by melted and solidified metal of said diode device connections.

3. The improved memory device of claim 1 or claim 2 wherein said integrated circuit is an integrated injection logic device.

4. An improved programmable integrated circuit comprising a plurality of programming signal inputs, a plurality of diode devices, a respective one of said diode devices being connected between each of said inputs and a common reference point with the forward direction of diode device current flow arranged to be from said input to said common reference point, a plurality of logic devices each of which is adversely affected by the application of programming signals to such programming signal inputs, said logic devices connected in cascade to provide a serial output, a plurality of resistors, one of said resistors being connected between each of said inputs and each of said logic devices respectively, selected one of said diode devices normally exhibiting a low impedance from their associated resistors to said common reference point, means for programming said series cascaded logic circuits comprising means for irreversibly programming said selected ones of said diode devices to cause said selected diode devices to exhibit a high impedance from their associated resistors to said common reference point in response to such programming signals applied to associated programming signal inputs, said resistors being dimensioned to block such adverse applied programming signal effects on said logic elements.

5. The improved memory device of claim 4 wherein each diode device presenting a low impedance from said resistor to said common reference point comprises a path formed by melted and solidified metal of said diode device connections.

6. The improved device of claim 4 or claim 5 wherein said integrated circuit is an integrated injection logic device.

7. In combination, an array of logic elements, means for combining said logic elements in a cascaded circuit to provide a serial output, each of said logic elements comprising first and second inputs and an output, programming circuits for programming given ones of said logic elements, each of said programming circuits comprising a programming signal limiter and an associated unidirectional conducting device, each of said unidirectional conducting devices comprising two terminals, means establishing a reference signal state at one terminal of each of said unidirectional conducting devices, means comprising said signal limiters each coupling the other terminal of its associated unidirectional conductive device to said first input of a respective logic element, each of said unidirectional conducting devices initially exhibiting a high impedance, and first means for applying first programming signals to the junctions between selected ones of said signal limiters and associated unidirectional conducting devices of said programming circuits to cause said last named unidirectional conducting devices to irreversibly exhibit a bidirectional low impedance which establishes the associated reference states at said last named junctions, said signal limiters being dimensioned to block adverse programming signal effects on said logic elements by said last named means.

8. An arrangement according to claim 7 further comprising second means for applying second programming signals to the junction between selected other ones of said signal limiters and associated unidirectional conducting devices of said programming circuits to establish the logic state corresponding to that of said second programming signals at said last named junctions, said logic elements responsive to control signals applied to said second inputs for providing said serial output in accordance with the logic states established at the junctions of said programming circuits.

9. A programmable shift register comprising an array of logic elements, a load circuit, means for combining said logic elements in a cascaded circuit to provide a serial output to said load circuit, each of said logic elements comprising first and second inputs and an output, programming circuits for programming given ones of said logic elements, each of said programming circuits comprising a resistor and an associated two terminal unidirectional conducting device, means establishing a reference signal state at one terminal of each of said unidirectional conducting devices, means comprising said resistors each coupling the other terminal of its associated unidirectional conductive device to said first input of a respective logic element, each of said devices initially exhibiting a high impedance, and first means for applying first programming signals to the junction between selected ones of said resistor and associated unidirectional conducting devices of said programming circuits to cause said last named unidirectional conducting devices to irreversibly exhibit a bidirectional low impedance which establishes said reference states at said last named junctions, said resistors being dimensioned to block adverse programming signal effects on said logic elements by said first means.

10. An arrangement according to claim 7 further comprising second means for applying second programming signals to the junction between selected other ones of said resistors and associated unidirectional conducting devices of said programming circuits to establish the logic state corresponding to that of said second programming signals at said last named junctions, said logic elements responsive to control signals applied to said second inputs for providing a serial output to said load circuit in accordance with the logic states established at the junctions of said programming circuits.

11. In combination, an array of logic elements, means for combining said logic elements in a cascaded circuit to provide a serial logic output, each of said logic elements comprising first and second inputs and an output, programming circuits for programming given ones of said logic elements, each of said programming circuits comprising a programming signal limiter and a two terminal unidirectional conducting device, means for establishing a desired signal state at one terminal of each of said unidirectional conducting devices, means comprising said signal limiters each coupling the other terminal of its associated unidirectional conductive device to said first input of a respective logic element, each of said devices initially exhibiting a high serial impedance, first means for selectively applying programming signals to the junctions between said signal limiters and associated unidirectional conducting devices
of given ones of said programming circuits to cause said unidirectional conducting devices to irreversibly exhibit a bidirectional low signal impedance which establishes the associated desired states at said junctions, said signal limiters being dimensioned to block adverse programming signal effects on said logic elements by said first means, and said logic elements responsive to control signals applied to said second inputs for providing a serial logic output in accordance with the established logic states at said junctions.

12. An arrangement according to claim 11 further comprising second means to selectively apply second logic signals to dynamically establish logic states at given other ones of said programming circuits to establish the logic states corresponding to that of said second logic signals.

* * * * *